United States Patent [19]

Taya

[11] Patent Number: 4,870,283

[45] Date of Patent: Sep. 26, 1989

[54] ELECTRIC MULTIPOLE LENS
[75] Inventor: Shunroku Taya, Mito, Japan
[73] Assignee: Hitachi, Ltd., Tokyo, Japan
[21] Appl. No.: 267,310
[22] Filed: Nov. 4, 1988
[30] Foreign Application Priority Data Nov. 20, 1987 [JP] Japan .................................. 62-293399

[51] Int. Cl.$^4$ ........................... H01J 3/18; H01J 49/42
[52] U.S. Cl. .................. 250/396 R; 250/292; 250/290; 313/361.1
[58] Field of Search ................... 250/396 R, 292, 290; 313/361.1

[56] References Cited

U.S. PATENT DOCUMENTS 3,410,997 11/1968 Brubaker ............................. 250/292
4,032,782 6/1977 Smith et al. ........................ 250/292

Primary Examiner—Jack I. Berman
Attorney, Agent, or Firm—Antonelli, Terry & Wands

[57] ABSTRACT

A multipole lens which focus or diffuse a charged particle beam having a metal cylinder mounted on the vacuum vessel and formed plural recesses on the inside wall of the meal cylinder, and plural cylindrical electrodes respectively mounted on said plural recesses through thin insulator. The cross-sectional shape of the each recess is a circular arcwise and the recess is formed along an central axis of the metal cylinder.

For example, the multipole lens in the present invention is used in a electrostatic quadrupole lens of mass spectrometer or used in a quadrupole mass spectrometer.

In this invention electric charging at the insulator is so little that the orbit of the charged particle beam can be very accurate for a long time.

10 Claims, 1 Drawing Sheet

ELECTRIC MULTIPOLE LENS

BACKGROUND OF THE INVENTION

The present invention relates to an electric multipole lens which focuses or diffuses the charged particle beam in a vacuum vessel such as an electrostatic quadrupole lens used as auxiliary lens of a mass spectrometer and an electric multipole lens used in a quadrupole mass spectrometer applied high frequency voltage.

In general electric multipole lenses, the most popular one is a quadrupole lens especially used in the quadrupole mass spectrometer.

One of the most conventional type of the electric multipole lens is shown in Japanese published Pat. No. 58-7228. (Corresponding is U.S. Pat. No. 4,032,782). In this conventional electric multipole lens, the four long rod electrodes are fixed to a ring insulator by using a bolt through a ring mounting metal.

Recently, very high accuracy of the charged particle beam is needed. But in these conventional type, the inventor of the present invention has found that it is difficult to obtain such high accuracy. Because the ring insulator is charged by scattered charged particles which pass through at the inside of the multipole lens, and the charged particle make the normal orbit of the charged particle beam distort.

Furtheremore, the rod electrodes are mounted almost on a point or very small area of the ring insulators. Therefore, the mechanical strength of the four rod electrodes in a rotational direction concerning with the central axis of four rod electrodes, that is to say, torsional ridigity of the four rod electrodes is so weak that it is difficult to obtain the high positional accuracy of the charged particle beam for a long time, because the position of the rod electrodes is gradually changed for a long time.

SUMMARY OF THE INVENTION

An important object of the present invention is to provide an electric multipole lens which is hardly charged by the scattering charged particle at the inside of the multipole lens, and has high positional accuracy of the orbit of the charged particle beam which is not disturbed by the charged particles on the surface of the insulator mounting the rod electrodes.

Another object of the present invention is to obtain an electric multipole lens which has a strong structure supporting the rod electrodes and the high positional accuracy of the orbit of the charged particle beam lasts for a long time.

In a multipole lens having plural cylindrical electrodes in a vacuum vessel and focussing or diffusing a charged particle beam which passes through a central space between the plural cylindrical electrodes, the technical feature of the present invention is in having the pulural cylindrical electrodes, each of which is mounted on a circular arcwise recess formed at the inside wall of a metal cylinder through a thin insulator like a film.

The thin insulator is disposed between the the cylindrical electrode and the circular arcwise recess of the metal cylinder, and the part of the insulator which is exposed in the metal cylinder is so small that the insulator is hardly charged by the scattering charged particles which come in the metal cylinder, and the orbit of the charged particle beam is not disturbed by ions which are charged on the insulator by charged particles.

Moreover, each cylindrical electrode fits in the circular arcwise recess of the metal cylinder which is mounted on the inside of the vacuum vessel, and the mounting strength of the cylindrical electrode in rotational direction is so high that the high positional accuracy of the orbit of the charged particle beam can be obtained for a long time.

DETAILED DESCRIPTION OF THE PREFERRED EMBODIMENTS

Figure 1:
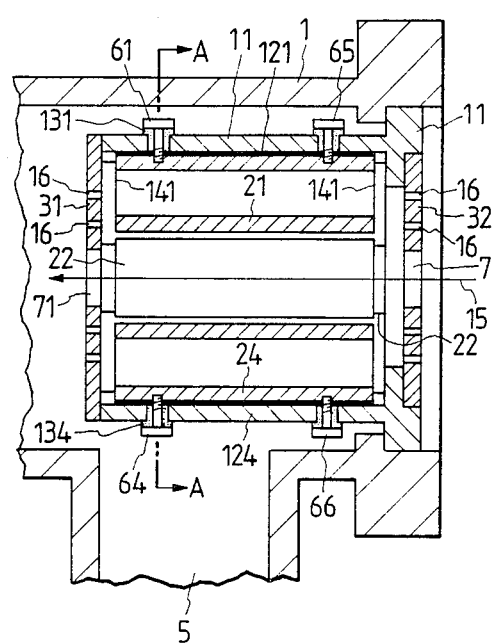
FIG. 1 is a diagrammatic cross-sectional view of a multipole lens embodying the present invention.
Figure 2:
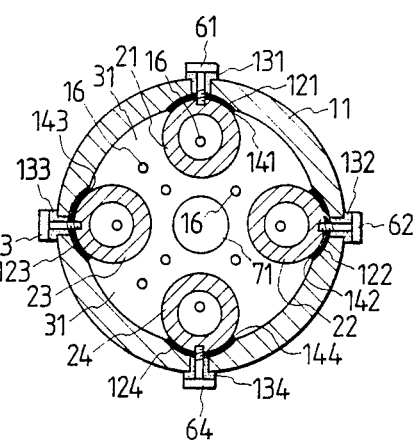
FIG. 2 is a diagrammatic cross-sectional view of the multipole lens in FIG. 1 seeing from a line A-A.

FIG. 1 and FIG. 2 show an embodiment of the present invention. The multipole lens shown in FIG. 1 has four cylindrical electrodes 21, 22, 23 and 24 which are symmetrically disposed with respect to an axis of a metal cylinder 11. In the inside wall of the metal cylinder, four recesses 121, 122, 123 and 124 are formed along the axis of the metal cylinder. The cross-sectional shape of each recess is a circular arc. Each cylindrical electrode 21, 22, 23 or 24 has a hollow hole at the central axis thereof and fits into the circular arcwise recesses 121, 122, 123 or 124 through thin insulator 141, 142, 143 and 144 such as a film. The cylindrical electrodes, 21, 22, 23 and 24 are fixed on the inside wall of the metal cylinder 11 by bolts 61, 62, 63 and 64 from the outside of the metal cylinder 11 through insulators 131, 132, 133 and 134 and thin insulators 141, 142, 143 and 144. The metal cylinder 11 is installed at the entrance side of the vacuum vessel 1, from which the charged particle beam 15 comes in. At both ends of the metal cylinder 11, shield electrodes 31, 32 are respectively attached, and have many small holes 16 for obtaining an evacuation. At the center of the shield electrodes 31, 32, there are holes 71, 72, and the charged particle beam 15 passes in from the hole 72 of the shield electrode 32 disposed in the entrance side of the vacuum vessel, passes through the central space between the four cylindrical electrodes 21, 22, 23 and 24, and passes out from the hole 71 of the shield electrode 31 disposed in the opposite side towards the entrance side. There is a vacuum evacuation hole 5 at the lower part of the vacuum vessel 1, and the air of the vessel 1 is evacuated by a vacuum pump which is not shown in FIG. 1 and 2. The many small holes 16 make the evacuation efficiency high. The hollow hole of the cylindrical electrodes 21, 22, 23 and 24 make the evacuation efficiency high too and make the weight thereof small.

The area of the insulators 141, 142, 143 and 144 is larger than the area of the cylindrical electrodes 21, 22, 23 and 24 opposed to the inner wall of the metal cylinder 11 in order to get a needed insulating distance, but the exposed parts of the insulators in the inside of the metal cylinder are so small that scattered charged particles which arise when the charged particle beam 15 comes in from the hole 72 are almost not able to charge up the insulators 141, 142, 143 and 144.

Figure 3:
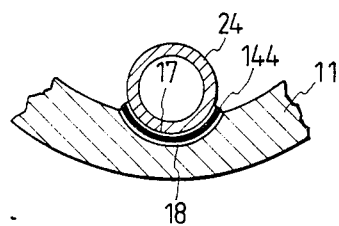
FIG. 3 and FIG. 4 respectively shows partial views of another embodyments of the present invention.
Figure 4:
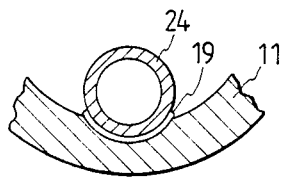

As shown in FIG. 3, the cylindrical electrodes 21 to 24 can be fixed to the recesses 121 to 124 by an adhesive agent 17, 18 through the insulators 141 to 144. Furthermore, using an adhesive agent 19 having enough insulation resistance for insulating the cylindrical electrodes 21 to 24 from the metal cylinder 11, the insulator 144 and the adhesive agent 17, 18 in FIG. 3 can be replaced by only the adhesive agent 19 as shown in FIG. 4. In FIG. 3 and FIG. 4, the cylindrical electrode 24 is light enough to be supported by the adhesive agent 17, 18, 19 as the inside of the cylindrical electrode 24 is hollow and the thickness thereof is thin.

I claim:

1. An electric multipole lens which focuses or diffuses a charged particle beam comprising:
   a metal cylinder mounted on a vacuum vessel and formed plural circular arcwise recesses along a central axis of said metal cylinder on the insidewall of the metal cylinder; and
   plural cylindrical electrodes respectively mounted on said plural circular arcwise recesses through insulators.

2. An electric multipole lens as in claim 1 where said plural cylindrical electrodes are fixed by bolt from the outside of said metal cylinder.

3. An electric multipole lens as in claim 1 where each of said plural cylindrical electrodes forms a hollow hole.

4. An electric multipole lens as in claim 1 where both ends of the metal cylinder have respectively mounted thereon metal discs having central holes.

5. An electric mulipole lens as in claim 4 where each of said discs has many small holes.

6. An electric multipole lens which focuses or diffuses a charged particle beam comprising:
   a metal cylinder mounted on the vacuum vessel and formed plural circular arcwise recesses along a central axis of said metal cylinder;
   plural cylindrical electrodes respectively mounted on said plural circular arcwise recesses; and
   insulators respectively disposed between said plural cylindrical electrodes and said plural circular arcwise recesses, the areas of each insulator being not smaller than the area where each of said cylindrical electrodes respectively opposes said plural circular arcwise recesses.

7. An electric multipole lens as in claim 6 where said plural cylindrical electrodes are respectively fixed by bolts from the outside of said metal cylinder.

8. An electric multipole lens as in claim 6 where said plural cylindrical electrodes respectively form a hollow holes.

9. An electric multipole lens as in claim 6 where both ends of the metal cylinder have respectively mounted thereon metal discs having central holes.

10. An electric multipole lens as in claim 9 where said discs have many small holes.

* * * * *